United States Patent [19]

Fujitsu

[11] Patent Number: 4,953,173
[45] Date of Patent: Aug. 28, 1990

[54] SEMICONDUCTOR DEVICE
[75] Inventor: Takao Fujitsu, Kitakami, Japan
[73] Assignee: Kabushiki Kaisha Toshiba, Kawasaki, Japan
[21] Appl. No.: 228,107
[22] Filed: Aug. 4, 1988
[30] Foreign Application Priority Data Aug. 8, 1987 [JP] Japan .................. 62-198443

[51] Int. Cl.$^5$ .......................... H01L 23/48
[52] U.S. Cl. .................. 372/74; 174/52.4; 372/72; 372/81
[58] Field of Search ............. 357/74, 72, 81; 174/52.4

[56] References Cited

U.S. PATENT DOCUMENTS 4,147,889 4/1979 Andrews ................ 174/52.4

Primary Examiner—James W. Davie
Attorney, Agent, or Firm—Foley & Lardner, Schwartz, Jeffery, Schwaab, Mack, Blumenthal & Evans

[57] ABSTRACT

A semiconductor device comprises an inverted-tray-shaped support frame having a concave inner surface, a semiconductor element supported by the support frame at the center of its inner surface, and a plurality of leads which are formed on the inner surface of the support frame over an insulative layer interposed therebetween, and which extend from the center of the support frame outward to the periphery hereof and are electrically connected at their inner root ends to respective electrodes of the semiconductor element. The support frame reinforces and preserves the mechanical strength of the leads, which can therefore be spaced more closely and accurately.

3 Claims, 1 Drawing Sheet

SEMICONDUCTOR DEVICE

BACKGROUND OF THE INVENTION

This invention relates generally to semiconductor devices and particularly to semiconductor devices in which leads used as a large number of input/output terminals are held on the inner surface of a metal support frame by way of a common insulating layer interposed therebetween.

Heretofore, DIP, FP, PLCC, and ceramic packages, for example, have been generally known as typical modes of package construction in semiconductor devices. In each of these packages, except for that of the lead-less chip carrier, the outer leads, which are the terminals for connection to the outside of the package, are so formed that each lead projects out independently for obtaining its individual electrical characteristic.

For this reason, each outer lead is in a state in which it can bend independently and therefore bends readily. Moreover, a precision of the relative positioning between leads of the order of only ±0.1 mm could be attained heretofore.

Furthermore, because of the need to prevent independent deforming of the leads, restrictions have been imposed on the lead material, lead thickness and width, and the pitch or spacing between the leads.

For example, in an FP (flat package), the minimum dimensions of the leads are at present a thickness of 0.15 mm, a width of 0.35 mm, and pitch between leads of 0.65 mm. For this reason, as the number of pins increases, the outer peripheral outline formed by the outer extremities of the outer leads of the package become large, and the size of the package accordingly has become increasingly large.

Because of the above mentioned restrictions, in the soldering process step during the process of mounting the semiconductor device on a printed wiring board or the like, a lead positional accuracy of the order of only ±0.1 mm can be attained at the present stage of the art, whereby particularly reduction of lead pitch distance has been difficult in general.

Furthermore, in the selection of the lead material, also, ample mechanical strength of this thin lead itself must be considered. In order to obtain this strength, the lead must have the high-strength characteristics of alloys containing nickel such as 42 alloy.

SUMMARY OF THE INVENTION

Accordingly, it is an object of this invention to provide a semiconductor device in which the above described problems encountered in the prior art are overcome, and the mounting characteristics of the device relative to a printed wiring board, that is, the mounting density, is improved by improving the lead positional precision and reducing the lead spacing pitch thereby to reduce the package size, whereby the packaging efficiency of multiple-pin semiconductor devices can be increased.

The above stated object has been achieved by this invention according to which there is provided a semiconductor device comprising a metal support frame provided on one surface thereof with a lining of an electrically insulative layer, a plurality of leads, which are formed by patterning on the surface of the electrically insulative layer, and which, in a mutually insulated state, extend from substantially the central part of the support frame outward to the periphery thereof, and a semiconductor element having a plurality of electrodes and mounted on the support frame at the central part thereof on the insulative layer side thereof, the electrodes of the semiconductor element being respectively connected electrically to the inner or root ends of corresponding leads.

According to this invention, the plurality of leads are held by way of and on an insulative layer on one surface of a metal support frame, whereby the mechanical strength of all of the leads is increased, and the rate of rejection of defective devices due to deformation of leads is greatly reduced. Furthermore, since the pitch between the leads can be reduced, the package size can be decreased, and the mounting density can be increased. In addition, since the inner leads can be formed with accurate pitch therebetween, positional precision can be improved, and accurate and positive mounting of the semiconductor device on a printed wiring board or the like can be accomplished. Particularly, since the pitch of the inner leads can be set at a small value, it can be made to approach the pitch between the electrodes of the semiconductor element, whereby the electrical connection therebetween is facilitated.

The nature, utility and further features of this invention will be more clearly apparent from the following detailed description when read in conjuction with the accompanying drawing, briefly described below.

DETAILED DESCRIPTION OF THE PREFERRED EMBODIMENT

Figure 1:
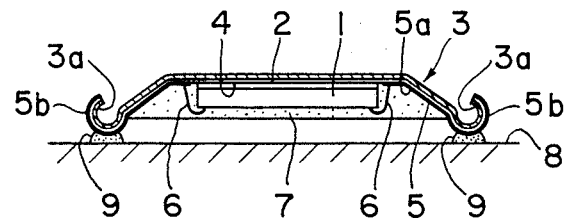
FIG. 1 is a sectional view showing the state of connection of a semiconductor device according to the invention to a printed wiring board.
Figure 2:
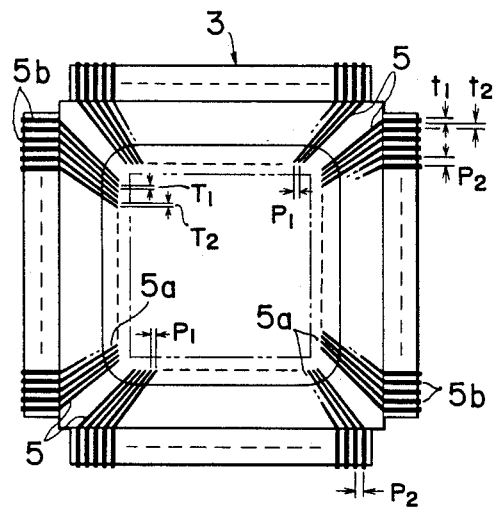
FIG. 2 is a plan view of the same semiconductor device as viewed from the inner side of the support frame thereof.
Figure 3:
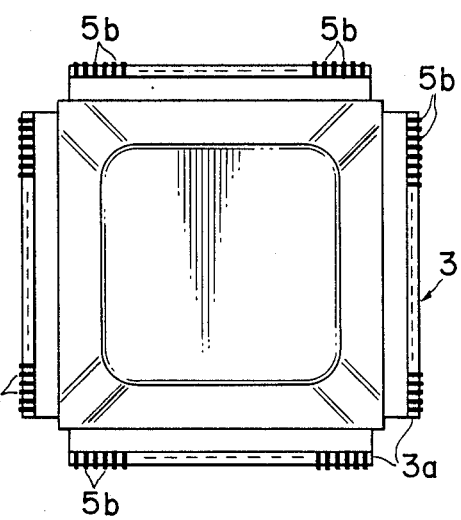
FIG. 3 is a plan view of the same semiconductor device as viewed from the outer side of the support frame.

Referring first to FIG. 1, a semiconductor element 1 is bonded by means of an adhesive 2 to the center of the inner wall surface of a support frame 3 of the shape of a rectangular inverted tray or dish shape as viewed in section as shown in FIG. 1. The entire inner wall surface of this support frame 3 is coated with an electrically insulative layer 4, on which a plurality of leads 5, each comprising an inner lead 5a and an outer lead 5b, are formed to extend outward from the center.

The support frame 3 in this example is formed from a thin aluminum sheet but it can also be formed from other thin metal sheets such as copper sheet or a ferrous alloy sheet, whereby the heat radiation performance can be improved. The entire inner surface of this support frame 3 is lined with an epoxy resin as the insulative layer 4, and, on this insulative lining, a plurality of leads 5 extending from the central part radially outward are formed by patterning. Each of these leads 5 comprises an inner lead 5a and an outer lead 5b.

The support frame 3 in the instant example is formed from a thin sheet of aluminum which can be mechanically formed, but any other formable material may be used. For example, a sheet structure of a resin such as epoxy resin or polyimide resin with a core of a metal wire or a metal mesh may be used.

The leads 5 are formed by first securing the lead blank material to the surface of the support frame 3 made of Al over the resin insulation layer 4 and thereafter carrying out pattern etching by leaving parts corresponding to the leads 5. In this case, the positional accuracy of the leads 5 is determined by the accuracy of etching of the copper foil. Here, the outer leads 5b are formed with a lead width of 0.1 mm ($t_1 = 0.1$ mm), a space between leads of 0.1 mm ($t_2 = 0.1$ mm), and a pitch of 0.2 mm ($P = 0.2$ mm).

Thus, by holding the leads 5 with the support frame 3: the mechanical strength of the leads is preserved; the positional accuracy of the leads 5 is improved; and the lead pitch is reduced.

The inner or root ends of the inner leads 5a and respective electrodes of the semiconductor element 1 are bonded by bonding wires 6. Furthermore, the semiconductor element 1 is resin sealed by a coating resin 7 for protection. The semiconductor device is thus physically organized.

Figure 4A:
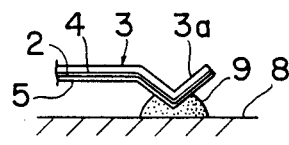
FIGS. 4(a) and 4(b) are fragmentary sectional views respectively showing two states of connection of an outer lead to a printed wiring board.
Figure 4B:
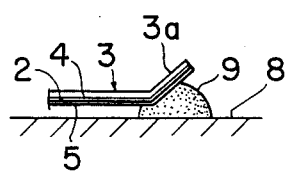

An additional feature of this example of the semiconductor device is that the periphery of the support frame 3 is curled into a partially circular shape as viewed in section, as shown in FIG. 1. This periphery 3a is provided for the purpose of electrically connecting the outer leads 5b and a printed wiring board 8 by soldering as at 9 as shown in FIG. 1. However, the periphery 3a may be formed into a Vee shape in section as shown in FIG. (4a), or into an upwardly bent shape as shown in FIG. 4(b), the sectional shape of the periphery 3a being selectable to suit the shapes of the printed wiring board 8 and the package.

What is claimed is:

1. A semiconductor device comprising a support frame formed from a thin aluminum sheet of rectangular shape and having over one surface thereof a lining of an electrically insulative layer, a plurality of leads formed by pattern etching on the surface of said insulative layer, the leads being electrically insulated from each other and extending from substantially the central part of said frame support to the outer peripheral part thereof, outer peripheral edges of the aluminum sheet coinciding with the outer ends of the leads, and a semiconductor element having a plurality of electrodes and mounted on the central part of said support frame on the insulative side thereof, said electrodes being electrically connected to the inner ends of the corresponding leads.

2. A semiconductor device according to claim 1 in which said support frame is bent along the peripheral part thereof thereby to form a concavity for accommodating said semiconductor element, the inner concave surface of the support frame being lined with said insulative layer.

3. A semiconductor device according to claim 1 in which said support frame is of inverted tray shape in section with a concave inner surface to which said semiconductor element is bonded with an adhesive, and said periphery of the base member is secured to a printed wiring board.

* * * * *